United States Patent
Wu et al.

(10) Patent No.: US 12,098,230 B2
(45) Date of Patent: Sep. 24, 2024

(54) BUILD-UP FILM WITH LOW DIELECTRIC LOSS, PREPARATION METHOD THEREFOR AND CIRCUIT SUBSTRATE STRUCTURE

(71) Applicant: WUHAN CHOICE TECHNOLOGY CO, LTD, Wuhan (CN)

(72) Inventors: De Wu, Wuhan (CN); Yi Wang, Wuhan (CN); Shuhang Liao, Wuhan (CN); Junxing Su, Wuhan (CN)

(73) Assignee: WUHAN CHOICE TECHNOLOGY CO, LTD, Wuhan (CN)

( * ) Notice: Subject to any disclaimer, the term of this patent is extended or adjusted under 35 U.S.C. 154(b) by 0 days.

(21) Appl. No.: 18/523,968

(22) Filed: Nov. 30, 2023

(65) Prior Publication Data

US 2024/0182619 A1  Jun. 6, 2024

Related U.S. Application Data

(63) Continuation of application No. PCT/CN2023/084227, filed on Mar. 28, 2023.

(30) Foreign Application Priority Data

Nov. 22, 2022 (CN) .......................... 202211469785.8

(51) Int. Cl.
| | | |
|---|---|---|
| *C08J 5/18* | (2006.01) | |
| *C08F 283/00* | (2006.01) | |
| *C08F 283/04* | (2006.01) | |
| *C08G 73/12* | (2006.01) | |
| *C08K 3/36* | (2006.01) | |
| *H05K 3/22* | (2006.01) | |

(52) U.S. Cl.
CPC ........ *C08F 283/00* (2013.01); *C08F 283/045* (2013.01); *C08G 73/12* (2013.01); *C08J 5/18* (2013.01); *C08K 3/36* (2013.01); *H05K 3/22* (2013.01); *C08J 2351/08* (2013.01)

(58) Field of Classification Search
CPC .. C08F 283/00; C08F 283/04; C08F 283/045; C08G 73/12; C08J 5/18; C08J 2351/08; C08K 3/36; H05K 3/22
See application file for complete search history.

(56) References Cited

U.S. PATENT DOCUMENTS

| | | | | |
|---|---|---|---|---|
| 2019/0169177 A1* | 6/2019 | Nam | ................... | C07D 265/14 |
| 2021/0009759 A1 | 1/2021 | Yao et al. | | |
| 2021/0147680 A1 | 5/2021 | Higashiguchi et al. | | |

FOREIGN PATENT DOCUMENTS

| | | | | | |
|---|---|---|---|---|---|
| CN | 106565746 | A | * | 4/2017 | .......... C07D 498/10 |
| CN | 106700424 | A | | 5/2017 | |
| CN | 111748206 | A | | 10/2020 | |
| CN | 112210210 | A | | 1/2021 | |
| CN | 113121999 | A | | 7/2021 | |
| CN | 113736255 | A | | 12/2021 | |
| CN | 114989418 | A | | 9/2022 | |
| CN | 115521411 | A | | 12/2022 | |
| JP | 2012167141 | A | | 9/2012 | |
| JP | 2018168217 | A | | 11/2018 | |
| JP | 2020158705 | A | | 10/2020 | |
| TW | 202100648 | A | | 1/2021 | |

OTHER PUBLICATIONS

Zhang Chi, et al., Synthesis and Characterization of a Bisphenol A-derived Diphenol and Corresponding Benzoxazine, Shandong Chemical Industry, 2021, pp. 18-19, vol. 50, No. 13.

* cited by examiner

*Primary Examiner* — Gerard Higgins
(74) *Attorney, Agent, or Firm* — Bayramoglu Law Offices LLC

(57) ABSTRACT

A build-up film with low dielectric loss, a preparation method therefor, and a circuit substrate structure are provided. The build-up film is prepared from raw materials including 5-10 parts by mass of monofunctional benzoxazine having indene oligomer, 40-65 parts by mass of polymerized aromatic-based maleimide, 30-50 parts by mass of allyl benzoxazine, 0.1-3 parts by mass of initiator, 250-400 parts by mass of inorganic filler, and 0.1-5 parts by mass of silane coupling agent. The build-up film has low dielectric loss and high tensile strength. Low dielectric loss enables it to be applied in the field of 5G. For example, the build-up film can be used to packaging integrated circuit substrates, which is conducive to minimizing the transmission loss.

11 Claims, No Drawings

BUILD-UP FILM WITH LOW DIELECTRIC LOSS, PREPARATION METHOD THEREFOR AND CIRCUIT SUBSTRATE STRUCTURE

CROSS REFERENCE TO THE RELATED APPLICATIONS

This application is a continuation application of International Application No. PCT/CN2023/084227, filed on Mar. 28, 2023, which is based upon and claims priority to Chinese Patent Application No. 202211469785.8, filed on Nov. 22, 2022, the entire contents of which are incorporated herein by reference.

TECHNICAL FIELD

The present application relates to the technical field of integrated circuit packaging, and specifically relates to a build-up film with low dielectric loss, a preparation method therefor, and a circuit substrate structure.

BACKGROUND

High-frequency signals cause severe transmission loss, and transmission loss is a pain point for antenna design and radio frequency (RF) integrated circuits (ICs) in 5G applications. With the rise of 5G millimeter waves in the future, low-loss materials play an important role in 5G applications. Low-loss materials can be used not only as substrates or PCBs, but also in advanced packaging such as antennas in package (AiP). With frequencies moving toward millimeter waves, the size of antenna elements will continue to decrease until the antenna array can be placed inside the package shell. This type of integration helps to shorten the RF path and minimize transmission loss, but at the same time requires the use of low-loss materials as substrates. Therefore, it is in line with the current market demand to develop materials for build-up films with low dielectric loss.

SUMMARY

It is an object of the present application to provide a build-up film with low dielectric loss, a preparation method therefor, and a circuit substrate structure. The build-up film has low dielectric loss and high tensile strength at the same time.

In order to achieve the above object, in a first aspect, an embodiment of the present application provides a build-up film with low dielectric loss, which is prepared from raw materials comprising 5-10 parts by mass of monofunctional benzoxazine having indene oligomer, 40-65 parts by mass of polymerized aromatic-based maleimide, 30-50 parts by mass of allyl benzoxazine, 0.1-3 parts by mass of initiator, 250-400 parts by mass of inorganic filler, and 0.1-5 parts by mass of silane coupling agent;

the monofunctional benzoxazine having indene oligomer has a chemical structural formula of

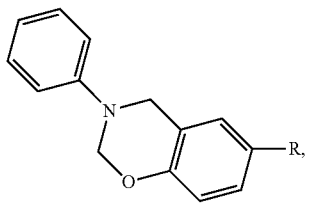

wherein, R is

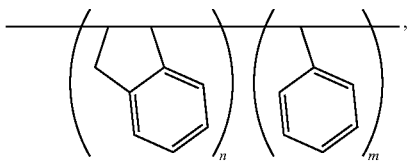

n and m are integers, 1≤n≤10, and 1≤m≤6.

In some specific embodiments, the raw materials of the build-up film preferably comprises 8-10 parts by mass of monofunctional benzoxazine having indene oligomer, 40-50 parts by mass of polymerized aromatic-based maleimide, 42-50 parts by mass of allyl benzoxazine, 0.1-3 parts by mass of initiator, 300-400 parts by mass of inorganic filler, and 0.1-5 parts by mass of silane coupling agent.

In some specific embodiments, the monofunctional benzoxazine having indene oligomer is prepared by a method comprising steps of:

aniline monomer, phenol having indene oligomer and paraformaldehyde are added to a reaction vessel in a molar ratio of (1-1.2):(1-1.4):(2-2.4), and an organic solvent is added at the same time to perform Mannich reaction under stirring for 4 to 15 hours at a temperature of 80-150° C. to obtain the monofunctional benzoxazine having indene oligomer.

In some specific embodiments, the initiator is bis(tert-butyldioxyisopropyl)benzene.

In some specific embodiments, the inorganic filler is silica.

In some specific embodiments, the silane coupling agent is 3-glycidyl oxypropyltrimethoxysilane.

In a second aspect, an embodiment of the present application provides a method for preparing a build-up film with low dielectric loss comprising steps of:

5-10 parts by mass of monofunctional benzoxazine having indene oligomer and 40-65 parts by mass of polymerized aromatic-based maleimide are mixed to obtain prepolymer, and the prepolymer is stirred at a temperature of 110° C. to 150° C.;

after the prepolymer is clarified, it is cooled to room temperature, 30-50 parts by mass of allyl benzoxazine, 0.1-3 parts by mass of initiator, 250-400 parts by mass of inorganic filler, 0.1-5 parts by mass of silane coupling agent and inorganic solvent are added to the prepolymer under stirring to obtain a mixture slurry;

the mixture slurry is coated on a base film by using a film applicator and dried to obtain the build-up film on the base film.

Preferably, the method for preparing a build-up film with low dielectric loss comprising steps of:

8-10 parts by mass of monofunctional benzoxazine having indene oligomer and 40-50 parts by mass of polymerized aromatic-based maleimide are mixed to obtain prepolymer, and the prepolymer is stirred at a temperature of 110° C. to 150° C.;

after the prepolymer is clarified, it is cooled to room temperature, 42-50 parts by mass of allyl benzoxazine, 0.1-3 parts by mass of initiator, 300-400 parts by mass of inorganic filler, 0.1-5 parts by mass of silane coupling agent and inorganic solvent are added and stirred to obtain a mixture slurry;

the mixture slurry is coated on a base film using a film applicator and dried to obtain the build-up film on the base film.

In a third aspect, an embodiment of the present application provides a circuit substrate structure including a central substrate layer and a build-up film, wherein the circuit substrate structure is prepared by coating the build-up film prepared by above method on an upper surface and/or a lower surface of the central substrate layer, and sequentially performing hot pressing and hot curing.

The circuit substrate coated with the build-up film having low dielectric loss also has low loss characteristics, which can be used to make integrated circuits to be used in the field of 5G to minimize transmission loss.

The present application has the following advantages and beneficial effects:

The build-up film according to the present application combines low dielectric loss with high tensile strength. The low dielectric loss makes it possible to be used in the field of 5G. For example, the build-up film according to the present application can be used for packaging integrated circuit substrates, which is conducive to minimizing transmission loss.

DETAILED DESCRIPTION OF THE EMBODIMENTS

In order to understanding the objectives, technical solutions and beneficial effects of the present application more clearly, the present application will be further described in detail in conjunction with examples.

An embodiment of the present application provides a build-up film with low dielectric loss, which is prepared from raw materials comprising 5-10 parts by mass of monofunctional benzoxazine having indene oligomer, 40-65 parts by mass of polymerized aromatic-based maleimide, 30-50 parts by mass of allyl benzoxazine, 0.1-3 parts by mass of initiator, 250-400 parts by mass of inorganic filler, and 0.1-5 parts by mass of silane coupling agent.

In the example of the present application, the monofunctional benzoxazine having indene oligomer has a chemical structural formula of:

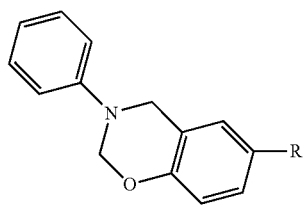
(I)

wherein, R is

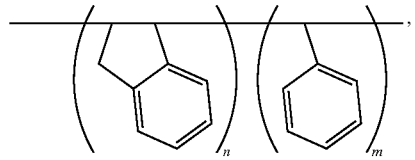, n and m are integers, 1≤n≤10 and 1≤m≤6.

In an embodiment of the present application, the monofunctional benzoxazine having indene oligomer is prepared by a method comprising step of:

aniline monomer, phenol having indene oligomer and paraformaldehyde are added to a reaction vessel in a molar ratio of (1-1.2):(1-1.4):(2-2.4), and an organic solvent is added at the same time to perform Mannich reaction under stirring for 4 to 15 hours at a temperature of 80-150° C. to obtain the monofunctional benzoxazine having indene oligomer.

In an embodiment of the present application, the phenol having indene oligomer has a chemical structure formula of:

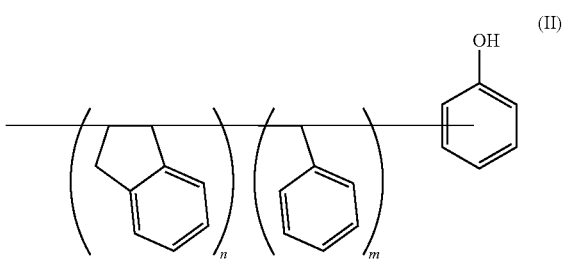
(II)

wherein, n and m are integers, 1≤n≤10 and 1≤m≤6.

In an embodiment of the present application, the initiator is capable of forming reactive free radicals under heating, thereby generating cross-linked macromolecules. The initiator can be a conventional initiator, such as organic peroxides, preferably bis(tert-butylperoxyisopropyl)benzene. The initiator is used in a conventional amount, usually 0.1-3 parts by mass, preferably 0.2 parts by mass in an embodiment of the present application.

In an embodiment of the present application, the inorganic filler is conventional inorganic filler, such as silica, titanium dioxide, calcium silicate, boron nitride, etc., preferably silica. The inorganic filler is used in a conventional amount, preferably 250-400 parts by mass, further preferably 250-300 parts by mass or 300-400 parts by mass in an embodiment of the present application.

In the embodiment of the present application, the silane coupling agent lies between the inorganic and organic interfaces, and is used to form a bonding layer between the interfaces, and connect the materials with different properties, thus forming a structure of organic matrix-silane coupling agent-inorganic matrix. The silane coupling agent is a conventional silane coupling agent, preferably 3-glycidyl oxypropyltrimethoxysilane, such as the commercially available KMB-403 silane coupling agent. The silane coupling agent is used in a conventional amount, usually 0.1-5 parts by mass, preferably 1 part by mass in the embodiment of the present application.

Among the raw materials for preparing the build-up film in the embodiment of the present application, the monofunctional benzoxazine having indene oligomer, the polymerized aromatic-based maleimide, and the allyl benzoxazine are resin monomers, and they are reacted in the presence of an initiator to obtain polymer. After curing, the polymerized aromatic-based maleimide can exhibit strong toughness and excellent properties, such as high temperature resistance, humidity and heat resistance, high modulus, high strength, etc., and can achieve high flame retardancy and low dielectric loss. In view of this, in the embodiment of the present application, by introducing the monofunctional benzoxazine having indene oligomer, the polymerized aromatic-based maleimide as the main resin monomer is carried out a blending modification to reduce the viscosity of the prepolymer of polymerized aromatic-based maleimide, and improve the overall performance without affecting the dielectric properties. In addition, the introduction of the allyl benzoxazine into the polymerized aromatic-based maleimide system, based on a double bond addition reaction, reduces the shrinkage after curing of the system, resulting in that the system has a low dielectric constant and a low loss factor.

In the embodiment of the present application, the polymerized aromatic-based maleimide is used in an amount of 40-65 parts by mass, further preferably 50-65 parts by mass, or 40-50 parts by mass; the monofunctional benzoxazine having indene oligomer is used in an amount of 5-10 parts by mass, further preferably 5-8 parts by mass, or 8-10 parts by mass; and the allyl benzoxazine is used in an amount of 30-50 parts by mass, further preferably 30-42 parts by mass, or 42-50 parts by mass.

The build-up film in the embodiment of the present application is prepared by a coating process as follows:

monofunctional benzoxazine having indene oligomer and polymerized aromatic-based maleimide are mixed in a mass ratio to obtain prepolymer, which is stirred at 130° C.; after the prepolymer is clarified, it is cooled to room temperature, allyl benzoxazine, initiator, inorganic filler, silane coupling agent and inorganic solvent are added to the prepolymer in a mass ratio and stirred to obtained a mixture slurry; and the mixture slurry is coated on a base film by using a film applicator and dried at 120° C. for 6 minutes to obtain the build-up film according to the present application on the base film. The base film is usually a PET film.

In the preparation of the build-up film, clarified prepolymer can be obtained by stirring the prepolymer at a temperature of 110° C. to 150° C. for 25-40 minutes. Inorganic solvent may include, but is not limited to, propylene glycol monomethyl ether acetate.

The build-up film obtained in the embodiment of the present application can be used to prepare a low-loss circuit substrate. The prepared circuit substrate structure includes a central substrate layer and a thermally cured build-up film. The thermally cured build-up film is applied to an upper surface and/or a lower surface of the central substrate. The circuit substrate is prepared as follows: the build-up film is laminated on the upper surface and/or the lower surface of the central substrate layer, the build-up film is made fit more closely to the central substrate at 90° C. and a pressure of 0.1 MPa and vacuum for 60 seconds, and then the build-up film is heated and cured at a temperature of 150° C. The build-up film can fill the gap on the surface of the central substrate, and is tightly bonded to the central substrate. The obtained low-loss circuit substrate can be used to produce circuits.

Several examples and comparative examples will be provided below, and the raw materials used in the examples and comparative examples are as follows:

Monofunctional benzoxazine having indene oligomer is made by the inventors;

Aniline monomer and paraformaldehyde are commercially available, Shanghai test reagent;

Phenol having indene oligomer is purchased from Nippon Steel Corporation, Model IP-100, which has the following structural formula, wherein n and m are integers, 1≤n≤10 and 1≤m≤6:

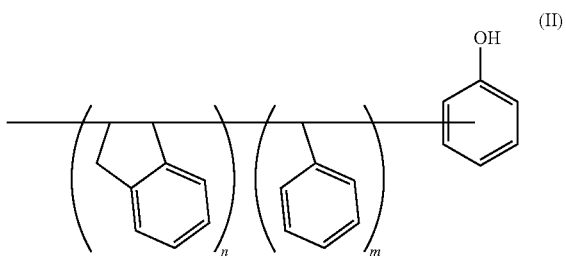

Bisphenol F benzoxazine is of a modelnumber of BZ-130,
Polymerized aromatic-based maleimide is commercially available as MIR-3000, with the following structural formula, where n is an integer and 1≤n≤2:

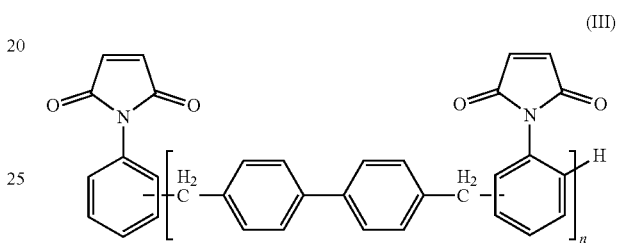

Allyl benzoxazine is commercially available as BZ-1706, with the following structural formula

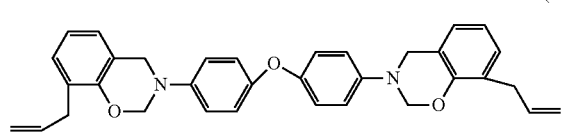

Bis(tert-butylperoxyisopropyl)benzene BIPB, as initiator, is commercially available, with a CAS No. 2212-81-9, and the following structural formula:

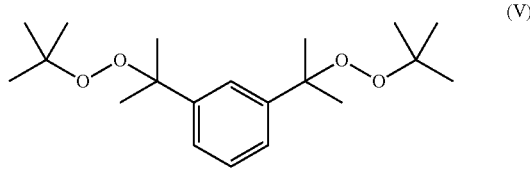 [SMILES: CC(C)(C)OOC(C)(C)c1cccc(C(C)(C)OOC(C)(C)C)c1]

Silica is spherical silicon micropowder with a particle size of 0.1-5 μm.

Silane coupling agent is KMB-403 type silane coupling agent.

The monofunctional benzoxazine having indene oligomer in the example of the present application was prepared as follows:

aniline monomer, phenol having indene oligomer and paraformaldehyde were added to a reaction vessel in a mass ratio of 1:1:2.1, while xylene was added thereto as a solvent, and the thus obtained mixture was stirred to perform Mannich reaction at a temperature of 120° C. for 8 hours, thereby obtaining monofunctional benzoxazine having indene oligomer.

The amounts of the components in the examples of the present application and comparative examples are shown in Table 1. The properties of the build-up films in the examples and comparative examples in Table 1 were tested as follows.

Determination of flowability: a square build-up film with a size of 5 mm×5 mm was sandwiched between two copper sheets and baked at 120° C. for 5 minutes, and the flowing distance of the build-up film on the copper sheets was observed. A flowing distance of more than 2 mm indicates good mobility and is recorded as ⊚; a flowing distance of no more than 2 mm indicates poor mobility and is recorded as X.

Determination of dielectric constant Dk and loss factor Df: referring to IPC TM-650 2.5.5.13-2007, "Relative Permittivity and Loss Tangent Using a Split-Cylinder Resonator", the dielectric constant Dk and loss factor Df was determined by using a square shaped build-up film sample with a size of 50 mm×70 mm×0.1 mm at a frequency of 10 GHz by a network analyzer.

Determination of tensile strength: referring to GB/T 1040.1-2018, "Determination of tensile properties of plastics", a build-up film sample with a size of 200 mm×5 mm×1 mm was tensioned to rupture at a speed of 50 mm/min using a universal tensile machine, and the maximum tensile stress was recorded as tensile strength.

TABLE 1

Amounts of components in the Examples and Comparative Examples

| | Example 1 | Example 2 | Example 3 | Comparative Example 1 | Comparative Example 2 |
|---|---|---|---|---|---|
| Monofunctional benzoxazine having indene oligomer | 5 | 10 | 8 | / | / |
| Bisphenol F benzoxazine | / | / | / | 8 | 35 |
| Polymerized aromatic-based maleimide | 65 | 40 | 50 | 50 | 65 |
| Allyl benzoxazine | 30 | 50 | 42 | 42 | 30 |
| Initiator | 0.2 | 0.2 | 0.2 | 0.2 | 0.2 |
| Silica | 250 | 400 | 300 | 300 | 250 |
| Silane coupling agent | 1 | 1 | 1 | 1 | 1 |

The performance parameter data of the examples and the comparative examples are shown in Table 2. It can be seen from Table 2 that when the polymerized aromatic-based maleimide is modified by blending with benzoxazine having indene oligomer and allyl benzoxazine at the same time, the product has reduced dielectric loss and improved tensile strength. The benzoxazine having indene oligomer can improve poor solubility and high curing temperature of the polymerized double aromatic-based maleimide resin and improve high brittleness of the cured material of the polymerized double aromatic-based maleimide resin; and the allyl benzoxazine is introduced into the polymerized aromatic-based maleimide system through double-bond addition reaction, which can reduce shrinkage after curing and reduce dielectric loss.

TABLE 2

Performance parameters of the products in Examples and Comparative Examples

| | Example 1 | Example 2 | Example 3 | Comparative Example 1 | Comparative Example 2 |
|---|---|---|---|---|---|
| Flowability | ⊚ | ⊚ | ⊚ | X | ⊚ |
| Dk | 3.3 | 3.2 | 3.2 | 3.4 | 3.6 |
| Df | 0.0024 | 0.0022 | 0.0023 | 0.0034 | 0.0043 |
| Tensile strength | 98 MPa | 104 MPa | 101 MPa | 87 MPa | 71 MPa |

The above-described examples are only examples made for the purpose of clear explanation, and are not a limitation of implementations. To a person of ordinary skill in the art, other different forms of changes or variations may be made on the basis of the above description, and it is not necessary or possible to exhaust all the examples herein, and therefore the obvious changes or variations induced are still within the scope of protection of the present invention and creation.

What is claimed is:

1. A build-up film with low dielectric loss, which is prepared from raw materials comprising 5-10 parts by mass of monofunctional benzoxazine having indene oligomer, 40-65 parts by mass of polymerized aromatic-based maleimide, 30-50 parts by mass of allyl benzoxazine, 0.1-3 parts by mass of initiator, 250-400 parts by mass of inorganic filler, and 0.1-5 parts by mass of silane coupling agent;

the monofunctional benzoxazine having indene oligomer has a chemical structural formula of

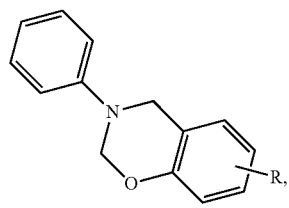

wherein R

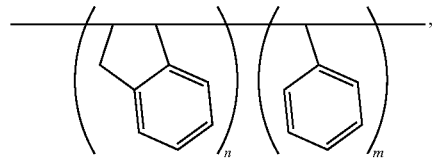

is n and m are integers, 1≤n≤10, and 1≤m≤6;
the polymerized aromatic-based maleimide has a structural formula of:

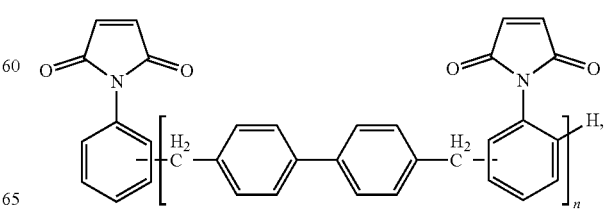

wherein n is an integer, 1≤n≤2; and
the allyl benzoxazine has a structural formula of:

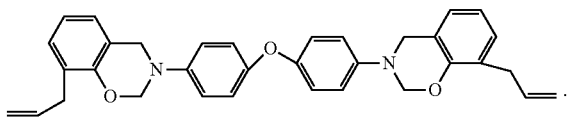

2. The build-up film with low dielectric loss according to claim 1, wherein the raw materials comprise 8-10 parts by mass of the monofunctional benzoxazine having indene oligomer, 40-50 parts by mass of the polymerized aromatic-based maleimide, 42-50 parts by mass of the allyl benzoxazine, 0.1-3 parts by mass of the initiator, 300-400 parts by mass of the inorganic filler, and 0.1-5 parts by mass of the silane coupling agent;
the monofunctional benzoxazine having indene oligomer has a chemical structural formula of

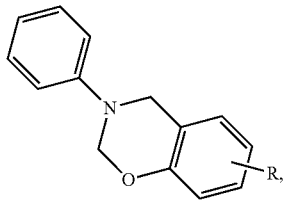

wherein R is

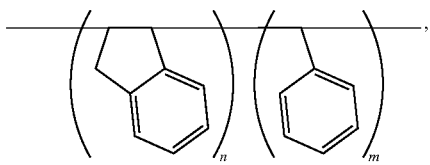

n and m are integers, 1≤n≤10, and 1≤m≤6;
the polymerized aromatic-based maleimide has a structural formula of:

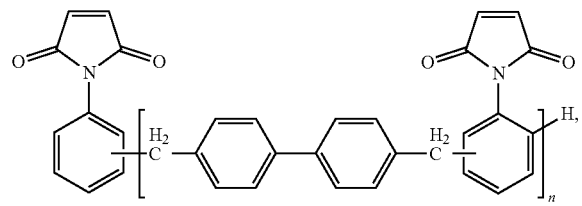

wherein n is an integer, 1≤n≤2; and the allyl benzoxazine has a structural formula of:

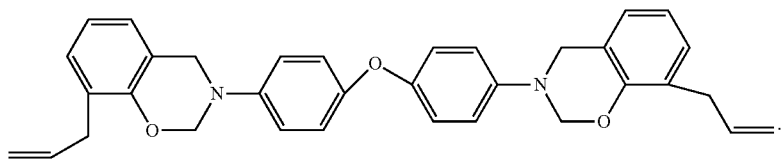 [SMILES: C=CCc1cccc2c1OCN(c1ccc(Oc3ccc(N4COc5c(CC=C)cccc5C4)cc3)cc1)C2]

3. The build-up film with low dielectric loss according to claim 1, wherein the monofunctional benzoxazine having indene oligomer is prepared by a method comprising steps of:
aniline monomer, phenol having indene oligomer, and paraformaldehyde are added to a reaction vessel in a molar ratio of (1-1.2):(1-1.4):(2-2.4), and an organic solvent is added at the same time to perform Mannich reaction under stirring at a temperature of 80-150° C. for 4 to 15 hours to obtain the monofunctional benzoxazine having indene oligomer.

4. The build-up film with low dielectric loss according to claim 3, wherein the phenol having indene oligomer has a chemical formula of

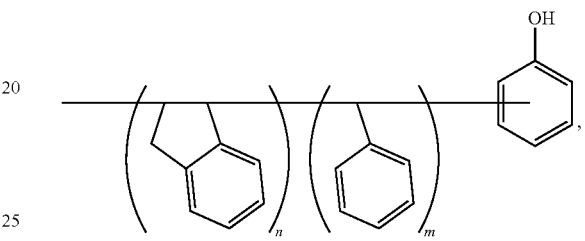

wherein n and m are integers, 1≤n≤10, and 1≤m≤6.

5. The build-up film with low dielectric loss according to claim 1, wherein the initiator is bis(tert-butylperoxyisopropyl)benzene.

6. The build-up film with low dielectric loss according to claim 1, wherein the inorganic filler is silica.

7. The build-up film with low dielectric loss according to claim 1, wherein the silane coupling agent is 3-glycidyl oxypropyltrimethoxysilane.

8. A method for preparing the build-up film with low dielectric loss according to claim 1, comprising the following steps:
5-10 parts by mass of the monofunctional benzoxazine having indene oligomer and 40-65 parts by mass of the polymerized aromatic-based maleimide are mixed to obtain prepolymer, and the prepolymer is stirred at a temperature of 110° C. to 150° C.;
after the prepolymer is clarified, it is cooled to room temperature, 30-50 parts by mass of the allyl benzoxazino, 0.1-3 parts by mass of the initiator, 250-400 parts by mass of the inorganic filler, and 0.1-5 parts by mass of the silane coupling agent and inorganic solvent are added to the prepolymer under stirring to obtain a mixture slurry;
the mixture slurry is coated on a base film using a film applicator and dried to obtain the build-up film on the base film;
the monofunctional benzoxazine having indene oligomer has a chemical structural formula of

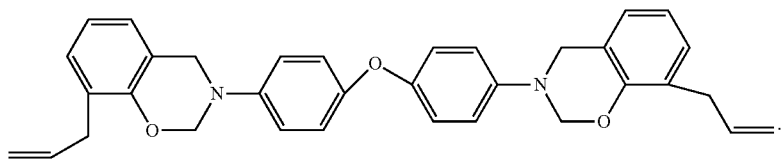 [SMILES: C=CCc1cccc2c1OCN(c1ccc(Oc3ccc(N4COc5c(CC=C)cccc5C4)cc3)cc1)C2]

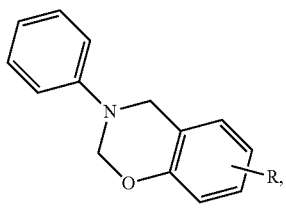

wherein R is

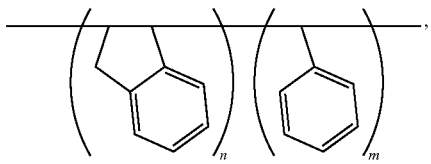

n and m are integers, 1≤n≤10, and 1≤m≤6.

9. The method for preparing the build-up film with low dielectric loss according to claim 8 comprising the following steps:
- 8-10 parts by mass of the monofunctional benzoxazine having indene oligomer and 40-50 parts by mass of the polymerized aromatic-based maleimide are mixed to obtain prepolymer, and the prepolymer is stirred at a temperature of 110° C. to 150° C.;
- after the prepolymer is clarified, it is cooled to room temperature, 42-50 parts by mass of the allyl benzoxazine, 0.1-3 parts by mass of the initiator, 300-400 parts by mass of the inorganic filler, and 0.1-5 parts by mass of the silane coupling agent and the inorganic solvent are added under stirring to obtain a mixture slurry;
- the mixed slurry is coated on a base film using a film applicator and dried at a temperature of 120° C. for 6 minutes to obtain the build-up film on the base film;
- the monofunctional benzoxazine having indene oligomer has a chemical structural formula of

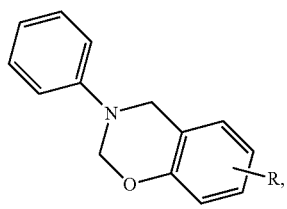

wherein R is

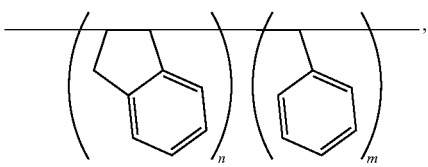

n and m are integers, 1≤n≤10, and 1≤m≤6.

10. A circuit substrate structure comprising a central substrate layer and a build-up film, wherein the circuit substrate structure is prepared by coating the build-up film on an upper surface and/or a lower surface of the central substrate layer, and sequentially performing hot pressing and hot curing, and the build-up film is a build-up film prepared by the method for preparing a build-up film with low dielectric loss according to claim 8.

11. A circuit substrate structure comprising a central substrate layer and a build-up film, wherein the circuit substrate structure is prepared by coating the build-up film on an upper surface and/or a lower surface of the central substrate layer, and sequentially performing hot pressing and hot curing, and the build-up film is a build-up film prepared by the method for preparing a build-up film with low dielectric loss according to claim 9.

* * * * *